(12) United States Patent
Haba et al.

(10) Patent No.: US 10,290,589 B2
(45) Date of Patent: May 14, 2019

(54) FOLDING THIN SYSTEMS

(71) Applicant: Invensas Corporation, San Jose, CA (US)

(72) Inventors: Belgacem Haba, Saratoga, CA (US); Ilyas Mohammed, Santa Clara, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 15/346,397

(22) Filed: Nov. 8, 2016

(65) Prior Publication Data

US 2018/0130757 A1    May 10, 2018

(51) Int. Cl.

| | |
|---|---|
| *H01L 23/495* | (2006.01) |
| *H01L 23/00* | (2006.01) |
| *H01L 23/498* | (2006.01) |
| *H01L 21/56* | (2006.01) |
| *H01L 23/31* | (2006.01) |
| *H01L 25/065* | (2006.01) |
| *H01L 23/538* | (2006.01) |
| *H01L 21/48* | (2006.01) |

(52) U.S. Cl.
CPC .......... *H01L 23/562* (2013.01); *H01L 21/565* (2013.01); *H01L 23/3121* (2013.01); *H01L 23/4985* (2013.01); *H01L 23/5387* (2013.01); *H01L 25/065* (2013.01); *H01L 21/4857* (2013.01); *H01L 23/3128* (2013.01); *H01L 23/49816* (2013.01); *H01L 23/49822* (2013.01)

(58) Field of Classification Search
CPC ........ H05K 2201/055; H01L 23/49822; H01L 23/49537; H01L 23/49562; H01L 23/49534; H01L 23/49548; H01L 23/49894; H01L 23/544; H01L 23/585
USPC ........................................................ 257/668
See application file for complete search history.

(56) References Cited

U.S. PATENT DOCUMENTS

| | | | |
|---|---|---|---|
| 7,071,547 B2 | 7/2006 | Kang et al. | |
| 8,404,977 B2 * | 3/2013 | Fjelstad | .................. H05K 3/32 174/251 |
| 8,630,658 B2 | 1/2014 | Wilson et al. | |
| 9,123,780 B2 | 9/2015 | Uzoh et al. | |
| 2006/0043562 A1 * | 3/2006 | Watanabe | ........... H01L 23/5387 257/686 |
| 2016/0172427 A1 | 6/2016 | Lee et al. | |

OTHER PUBLICATIONS

Braun, T., et al., "Foldable Fan-out Wafer Level Packaging," 2016 IEEE 66th Electronic Components and Technology Conference, Jun. 2016, 6 pages.

* cited by examiner

*Primary Examiner* — Theresa T Doan (57) ABSTRACT

A foldable microelectronic assembly and a method for forming the same are provided. One or more packages comprising encapsulated microelectronic elements are formed, along with a compliant layer. The packages and the compliant layer are coupled to a redistribution layer. The compliant layer and the redistribution layer are bent such that the redistribution layer is non-planar.

14 Claims, 9 Drawing Sheets

FOLDING THIN SYSTEMS

FIELD

The following description relates to packaging of integrated circuits ("ICs"). More particularly, the following description relates to foldable arrangements for ICs.

BACKGROUND

The demand for more compact physical arrangements of microelectronic elements such as integrated chips and dies has become even more intense with the rapid progress of portable electronic devices, the expansion of the Internet of Things, nano-scale integration, subwavelength optical integration, and more. Merely by way of example, devices commonly referred to as "smart phones" integrate the functions of a cellular telephone with powerful data processors, memory and ancillary devices such as global positioning system receivers, electronic cameras, and local area network connections along with high-resolution displays and associated image processing chips. Such devices can provide capabilities such as full internet connectivity, entertainment including full-resolution video, navigation, electronic banking and more, all in a pocket-size device. Complex portable devices require packing numerous chips and dies into a small space.

Microelectronic elements often comprise a thin slab of a semiconductor material, such as silicon or gallium arsenide. Chips and dies are commonly provided as individual, prepackaged units. In some unit designs, the die is mounted to a substrate or a chip carrier, which is in turn mounted on a circuit panel, such as a printed circuit board (PCB). Dies can be provided in packages that facilitate handling of the die during manufacture and during mounting of the die on the external substrate. For example, many dies are provided in packages suitable for surface mounting. Numerous packages of this general type have been proposed for various applications. Most commonly, such packages include a dielectric element, commonly referred to as a "chip carrier" with terminals formed as plated or etched metallic structures on the dielectric. The terminals typically are connected to the contacts (e.g., bond pads) of the die by conductive features such as thin traces extending along the die carrier and by fine leads or wires extending between the contacts of the die and the terminals or traces. In a surface mounting operation, the package may be placed onto a circuit board so that each terminal on the package is aligned with a corresponding contact pad on the circuit board. Solder or other bonding material is generally provided between the terminals and the contact pads. The package can be permanently bonded in place by heating the assembly so as to melt or "reflow" the solder or otherwise activate the bonding material.

Many packages include solder masses in the form of solder balls that are typically between about 0.1 mm and about 0.8 mm (5 and 30 mils) in diameter, and are attached to the terminals of the package. A package having an array of solder balls projecting from its bottom surface (e.g., surface opposite the front face of the die) is commonly referred to as a ball grid array or "BGA" package. Other packages, referred to as land grid array or "LGA" packages are secured to the substrate by thin layers or lands formed from solder. Packages of this type can be quite compact. Certain packages, commonly referred to as "chip scale packages," occupy an area of the circuit board equal to, or only slightly larger than, the area of the device incorporated in the package. This scale is advantageous in that it reduces the overall size of the assembly and permits the use of short interconnections between various devices on the substrate, which in turn limits signal propagation time between devices and thus facilitates operation of the assembly at high speeds.

Packaged semiconductor dies can also be provided in "stacked" arrangements, wherein one package is provided, for example, on a circuit board or other carrier, and another package is mounted on top of the first package. These arrangements can allow a number of different dies to be mounted within a single footprint on a circuit board and can further facilitate high-speed operation by providing a short interconnection between the packages. Often, this interconnect distance can be only slightly larger than the thickness of the die itself. For interconnection to be achieved within a stack of die packages, interconnection structures for mechanical and electrical connection may be provided on both sides (e.g., faces) of each die package (except for the topmost package). This has been done, for example, by providing contact pads or lands on both sides of the substrate to which the die is mounted, the pads being connected through the substrate by conductive vias or the like. Examples of stacked chip arrangements and interconnect structures are provided in U.S. Patent App. Pub. No. 2010/0232129, the disclosure of which is incorporated by reference herein.

Some solutions also include the use of flexible substrates and printed circuits, or folded circuit carriers. One or more v-shaped cuts, for example, can be made in a carrier and in package encapsulant, providing an edge for folding the package onto itself into a quasi-stacked arrangement. Difficulties arise due to mechanical stresses on the substrates and carriers from the bending and folding, which can lead to failure of the circuit or the package.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

For this discussion, the devices and systems illustrated in the figures are shown as having a multiplicity of components. Various implementations of devices and/or systems, as described herein, may include fewer components and remain within the scope of the disclosure. Alternately, other implementations of devices and/or systems may include additional components, or various combinations of the described components, and remain within the scope of the disclosure.

DETAILED DESCRIPTION

Overview

A microelectronic assembly is disclosed, comprising a redistribution layer (RDL), one or more microelectronic elements (IC chips, dies, etc.), and a compliant layer. The one or more microelectronic elements may be packaged (e.g., encapsulated, etc.), and are coupled to the RDL. For instance, the microelectronic elements are electrically coupled to one or more conductive layers of the RDL. The compliant layer is coupled to the RDL adjacent to or near the packages, for example, and can mitigate mechanical stresses of bending or folding the microelectronic assembly.

For example, in various embodiments, the RDL comprises a generally thin, rigid or semi-rigid layer that is potentially brittle. The RDL has a minimal thickness, to redistribute connections from connection points on the microelectronic element(s) to other points along a surface of the RDL, to make connections to carriers and the like. Conventional RDL layers similar to the RDL contemplated herein are typically applied on the surface of a microelectronic device and are too thin and brittle to provide any structural support to the microelectronic device. RDL typically consists of alternating layers of insulator, such as an oxide, polyimide, etc., and conductor, such as copper, aluminum, nickel, etc. RDL is not commonly intended to bend, and will likely crack or break without the support of the compliant layer as described herein.

In various implementations, the one or more packages comprising encapsulated microelectronic elements are formed, along with the compliant layer, and then the microelectronic elements and the compliant layer are coupled to the RDL in a desired arrangement. In alternate embodiments, some components may be formed on the RDL. The compliant layer is formed to an arcuate shape and the RDL is bent, such that the RDL is non-planar. For example, the RDL may be bent to a desired angle (e.g., 90 degrees, or a lesser or greater angle), or the RDL may be bent so that one portion of the RDL is folded over another portion of the RDL, the two portions being substantially parallel.

In various aspects of the disclosure, features may be molded into the package of the microelectronic elements. For example, interlocking features may be molded into one or more surfaces of the packages, the features interlocking when the RDL is folded and the packages make contact in a predetermined arrangement.

In an embodiment, several bends or folds in the RDL may be desirable for an application. In the embodiment, the RDL includes multiple portions, with compliant layers disposed between the portions. Various ones of the portions may or may not include microelectronic elements. In the embodiment, the compliant layers disposed between the portions allow the RDL to be folded or bent at the location of the compliant layers, while mitigating the mechanical stresses associated with the bend. In some implementations, an additional compliant layer may be disposed on an opposite surface of the RDL, opposite a compliant layer. The additional compliant layer further adds to the stress mitigation at a desired fold or bend location. More particularly, As the package(s) are folded, the compliant layer provides a counteracting force along the length of the folding area. This generally guides the RDL into a more gentle arcuate shaped than would be achievable without the compliant layer.

One aspect of the disclosure provides terminal pads, terminals, solder balls, and the like disposed on a surface of the RDL. For example, the terminals may be electrically coupled to one or more of the conductive layers of the RDL, such that the microelectronic assembly can be mounted to another carrier, such as a PC board or the like. In one embodiment, when the RDL is folded, the terminals may be available on the top of the microelectronic assembly structure as well as on the bottom.

Various implementations and arrangements are discussed with reference to electrical and electronics components and varied carriers. While specific components (i.e., integrated circuit (IC) chips, wafers, substrates, printed circuit boards (PCB), discrete components, etc.) are mentioned, this is not intended to be limiting, and is for ease of discussion and illustrative convenience. The techniques and devices discussed are applicable to any type or number of packages, packaged circuits or components, circuits (e.g., integrated circuits (IC), mixed circuits, ASICS, memory devices, processors, etc.), electrical components or groups of components, carrier structures (e.g., wafers, substrates, panels, boards, PCBs, etc.), and the like. Each of these components, circuits, chips, structures, and the like, can be generically referred to as a "microelectronic element." Further, references to a specific component are also applicable to other types of microelectronic elements, unless specified.

Implementations are explained in more detail below using a plurality of examples. Although various implementations and examples are discussed here and below, further implementations and examples may be possible by combining the features and elements of individual implementations and examples.

Example Foldable Microelectronic Assembly

Figure 1:
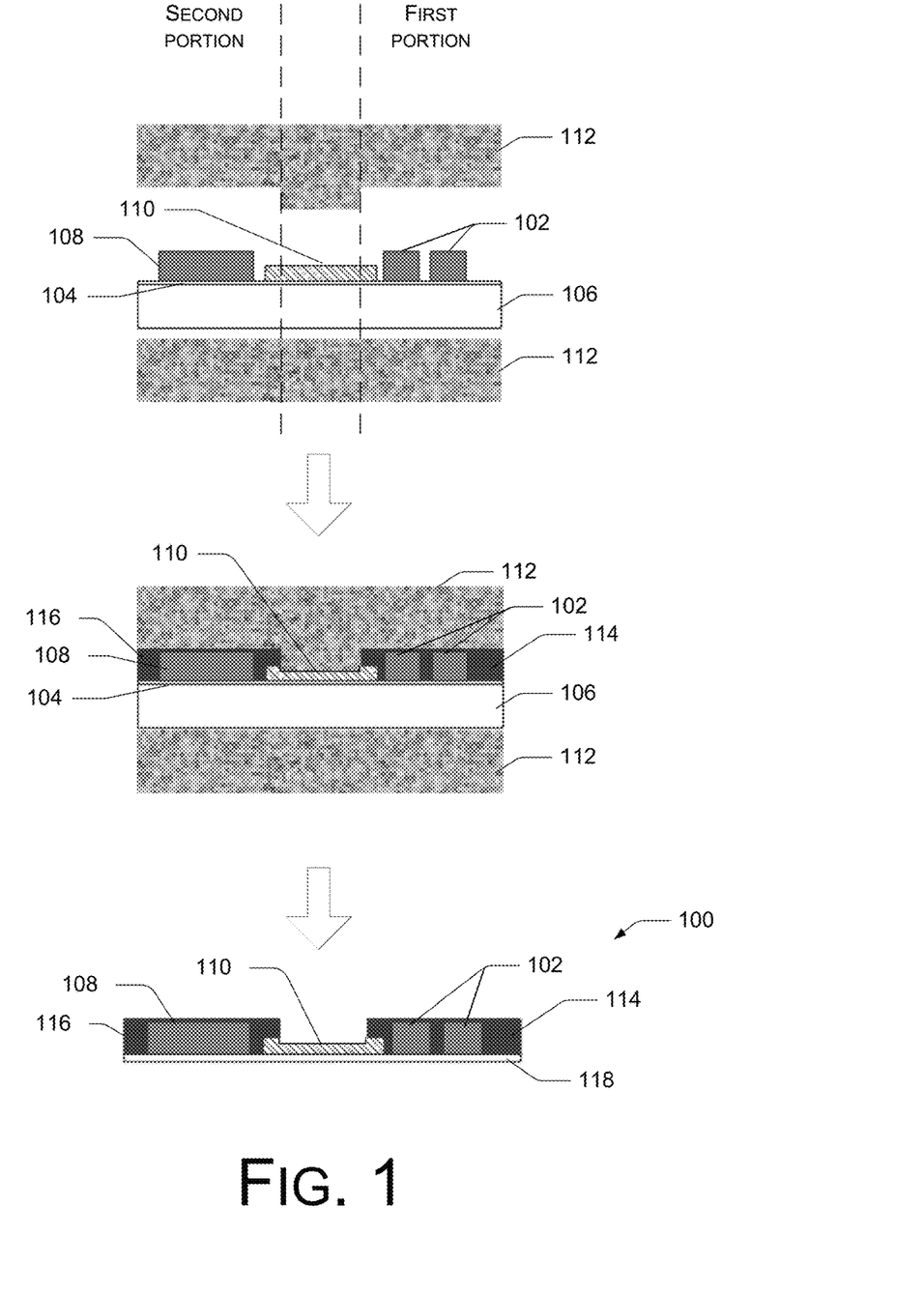
FIG. 1 is an illustration of an example process of forming a foldable microelectronic assembly, according to an implementation.

FIG. 1 illustrates an example process of forming a foldable microelectronic assembly 100, according to an implementation. The processes illustrated in FIGS. 1-9 are not intended to be limiting. A foldable microelectronic assembly 100 may be formed by various other processes, and may include alternate, fewer, or additional components than those illustrated.

In an embodiment, as shown in FIG. 1, one or more microelectronic elements 102 are deposited at a first region of a temporary layer 104 and/or 106. For example, a temporary layer 104 may include a film, adhesive layer, thin substrate, etc. Alternately or additionally, a temporary layer 106 may include a carrier or substrate comprised of a silicon, glass, ceramic, metallic, or like material. For the purposes of the disclosure, the "first region" of the temporary layer 104 and/or 106 includes a portion of the temporary layer 104 and/or 106 that is designated or desirable to be folded or bent with respect to other portions or with respect to the rest of the temporary layer 104 and/or 106. In the illustrations of FIGS. 1-8, the first region is identified as one of the left region or the right region of the illustrations.

Figure 2:
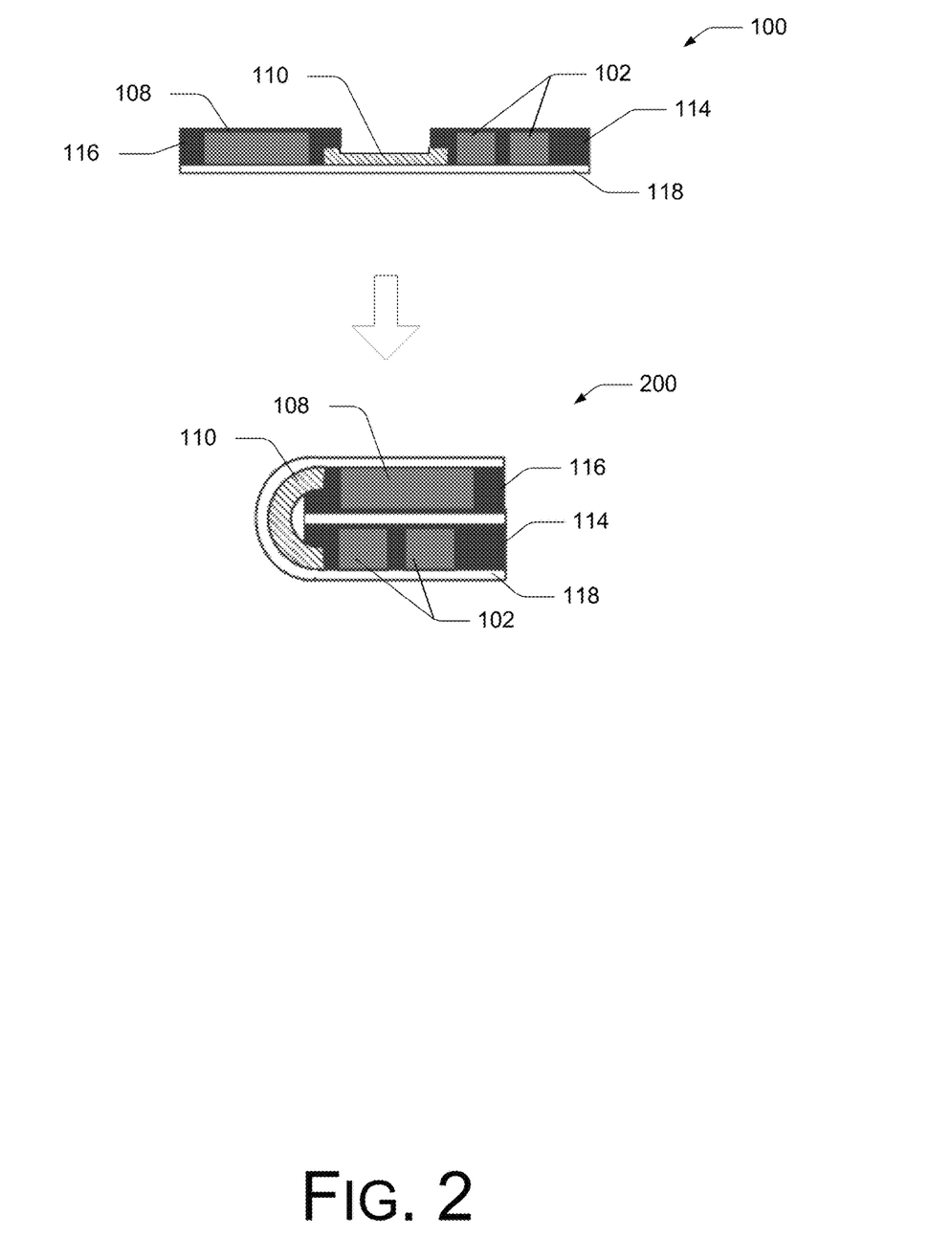
FIGS. 2-6 are illustrations showing various examples of forming folded microelectronic assemblies, according to several example embodiments.
Figure 3:
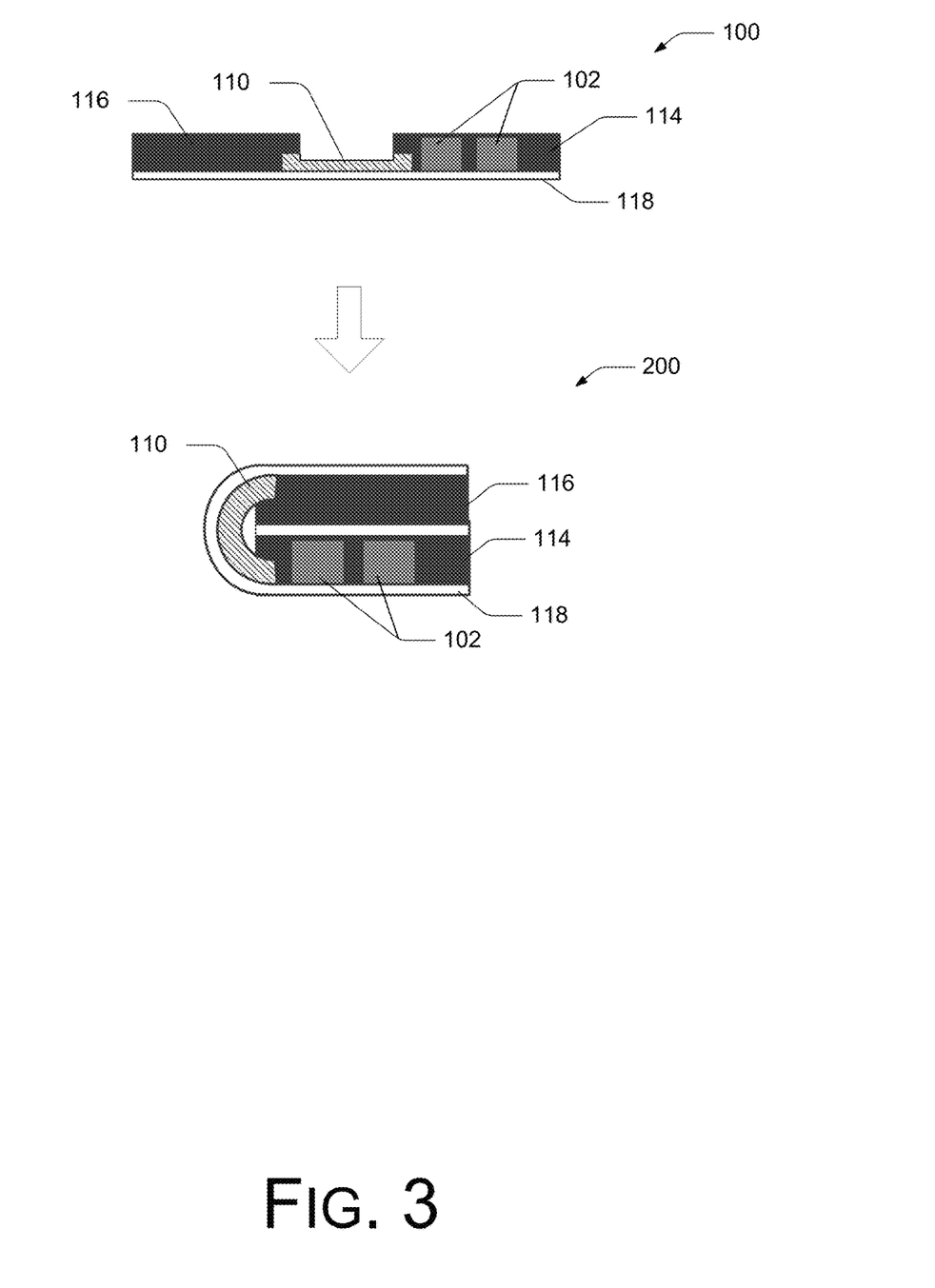

A "second region" of the temporary layer 104 and/or 106 includes another portion that is designated or desirable to be folded or bent with respect to the first region, other regions, or with respect to the rest of the temporary layer 104 and/or 106. Accordingly, in the illustrations of FIGS. 1-8, the second region of the temporary layer 104 and/or 106 is identified as the other of the left region or the right region (apart from the first region). In various embodiments, one or more second microelectronic elements 108 are deposited at the second region of the temporary layer 104 and/or 106. In alternate examples, an encapsulant package without microelectronic elements 108 may be deposited at the second region (as shown at FIG. 3), or the second region may be left empty (not shown).

Figure 6:
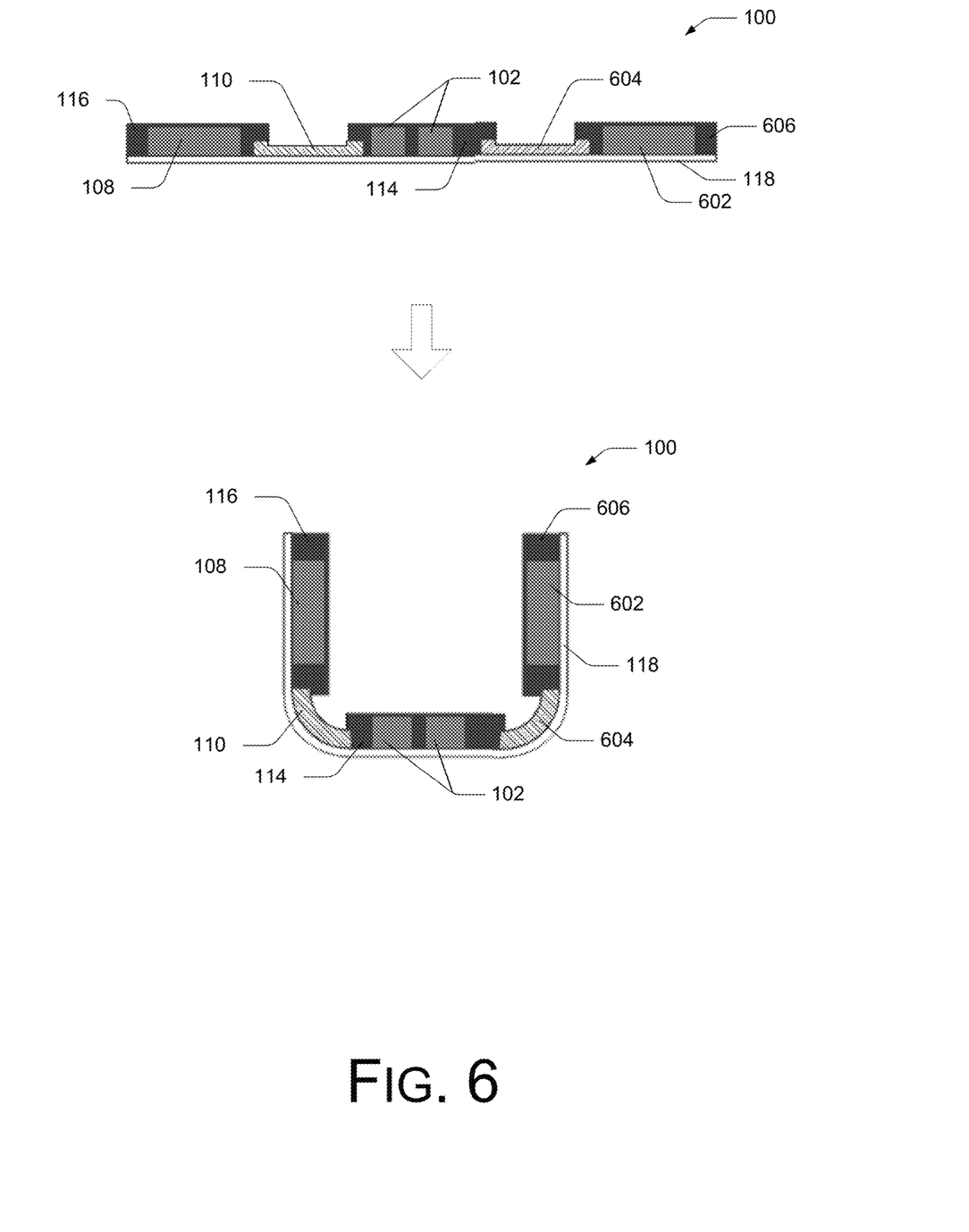

In an implementation, the temporary layer 104 and/or 106 includes one or more additional regions that are designated or desirable to be folded or bent with respect to the first and/or second regions or with respect to the rest of the temporary layer 104 and/or 106 (see FIG. 6). In the implementation, one or more additional microelectronic elements 602 may be deposited at the additional region(s) of the temporary layer 104 and/or 106.

As shown in FIG. 1, a compliant layer 110 is deposited at a region of the temporary layer 104 and/or 106 between the first region and the second region of the temporary layer 104 and/or 106. As shown, the compliant layer 110 may partially extend into the first region and partially extend into the second region of the temporary layer 104 and/or 106. In various embodiments, the compliant layer 110 may comprise a material that is substantially compliant at least under a desired set of circumstances (e.g., ranges of temperature, pressure, etc.), such as a polymer, a curable elastomer, or the like. For example, the compliant layer 110 may be moldable, bendable, shapeable, etc. throughout a range of temperatures, pressures, etc. that represent the likely operating environment and/or manufacturing environment for the microelectronic assembly 100. In some embodiments, the compliant layer 110 may cure to the desired compliance characteristics during processing or post processing.

In an implementation, the one or more first microelectronic elements 102, the compliant layer 110, and the temporary layer 104 and/or 106 are placed into a mold 112. If desired, the one or more second microelectronic elements 108 are also placed in the mold 112. As shown in FIG. 1, the mold 112 has at least a first portion corresponding to the first region of the temporary layer 104 and/or 106 and a second portion corresponding to the second region of the temporary layer 104 and/or 106. In an embodiment, the compliant layer 110 can form a barrier between the first portion and the second portion of the mold 112. The two-part mold 112 shown in FIG. 1 is an example, and in various implementations, different types of molds 112 may be used in the process.

The mold 112 is filled with an encapsulant (e.g., molding, filler, etc.) to form a first package portion 114 corresponding to the first portion of the mold 112. The first package portion 114 fully or partially encapsulates the one or more first microelectronic elements 102. If desired, filling the mold 112 also forms a second package portion 116 corresponding to the second portion of the mold 112. The second package portion 116 fully or partially encapsulates the one or more second microelectronic elements 108. In an embodiment, the encapsulant also encapsulates a portion of each end of the compliant layer 110, coupling the compliant layer 110 to the first 114 and second 116 package portions.

The first package portion 114, the second package portion 116 (if present), and the compliant layer 110 are removed from the mold 112. In an embodiment, the first package portion 114 and the second package portion 116 (if present) remain coupled to the compliant layer 110 by the encapsulant.

As shown in FIG. 1, the first package portion 114, the second package portion 116 (if present), and the compliant layer 110 are coupled to a RDL 118 to form the foldable microelectronic assembly 100. The RDL 118 comprises one or more conductive layers (including traces, etc.) and one or more insulating layers. In an embodiment, the RDL comprises a semi-flexible redistribution layer (RDL).

For the purposes of the disclosure, the RDL 118 includes a first portion and a second portion corresponding to the first region and the second region of the temporary layer 104, 106. Accordingly, the first package portion 114 is coupled to the RDL 118 at a first portion of the RDL 118, and the first microelectronic elements 102 are coupled to one or more conductive layers of the RDL 118. If present, the second package portion 116 is coupled to the RDL 118 at a second portion of the RDL 118, and the second microelectronic elements 108 are also coupled to one or more conductive layers of the RDL 118. In this form, the microelectronic assembly 100 may be folded or bent as desired for its intended application.

In an alternate implementation, the first 102 and second 108 microelectronic elements may be placed in the mold 112 with terminal contacts exposed (not shown). The compliant layer 110 may be placed between the first 102 and second 108 microelectronic elements, and the mold 112 is filled to form the first 114 and second 116 package portions. The compliant layer 110 is coupled to the first 114 and second 116 package portions by the encapsulant. The RDL can be added to the "terminal contact" side of the first 114 and second 116 package portions and the compliant layer 110 after molding.

As shown in FIGS. 2-8, the microelectronic assembly 100 may be folded or bent in various arrangements. Folding the microelectronic assembly 100 includes forming the compliant layer 110 to have an arcuate shape and bending the RDL 118 such that the first portion and the second portion of the RDL 118 are non-coplanar. The compliant layer 110 and the RDL 118 have a conforming shape at the location of the bend or fold so that the compliant layer 110 can reinforce the RDL 118 to reduce mechanical stress on the RDL 118 at the bend or fold.

In various embodiments, the microelectronic assembly 100 may be bent or folded in an infinite range of angles (e.g., 0-360 degrees), with respect to the first 114 and second 116 package portions or the first and second portions of the RDL 118. For example, as shown in FIG. 2, the compliant layer 110 and the RDL 118 may be shaped, formed, bent, folded, etc. such that a surface of the first package portion 114 makes contact with a surface of the second package portion 116 (if present), and the first 114 and second 116 package portions are parallel. This parallel arrangement may be referred to as a folded microelectronic assembly 200. If the second package portion 116 is not present, the first and second portions of the RDL 118 are bent so that they are parallel. FIG. 3 shows another form of the folded microelectronic assembly 200, where only first microelectronic elements 102 are present, but first 114 and second 116 package portions are used. For example, the second package portion 116 might be desirable even though no second microelectronic elements 108 are present for easier manufacturing, stability of the folded microelectronic assembly 200 structure, and the like.

Figure 4:
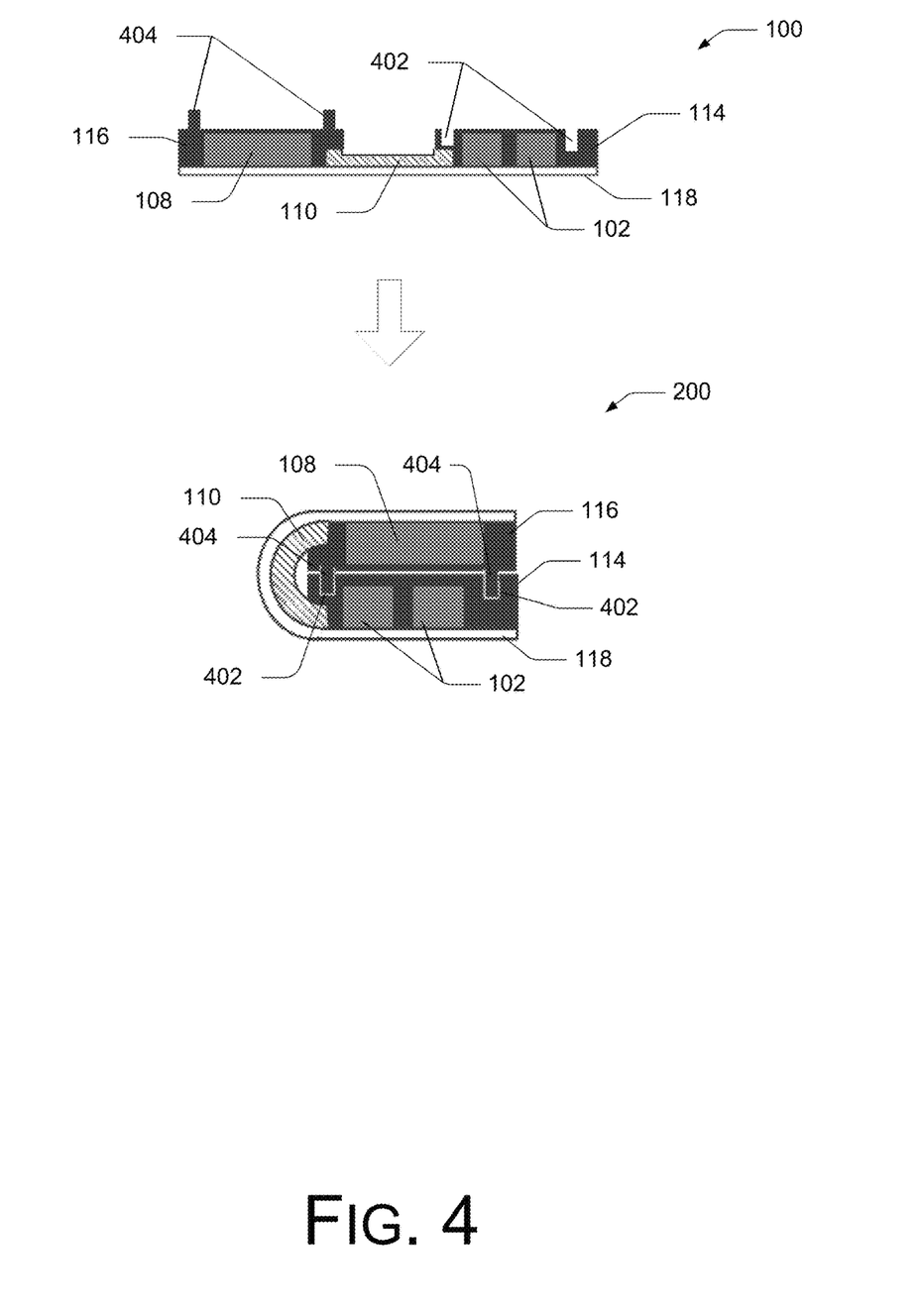

For example, in some embodiments as shown in FIG. 4, interlocking features may be molded into the package portions 114 and 116 for structural stability of the folded microelectronic assembly 200. As shown in FIG. 4, first features 402 are molded into the first package portion 114 and second features 404 are molded into the second package portion 116. The first features 402 are adapted to interlock with the second features 404 when the compliant layer 110 and the RDL 118 are bent such that a surface of the first package portion 114 makes contact with a surface of the second package portion 116. In various embodiments, the features 402, 404 may have different interlocking shapes as desired.

Figure 5:
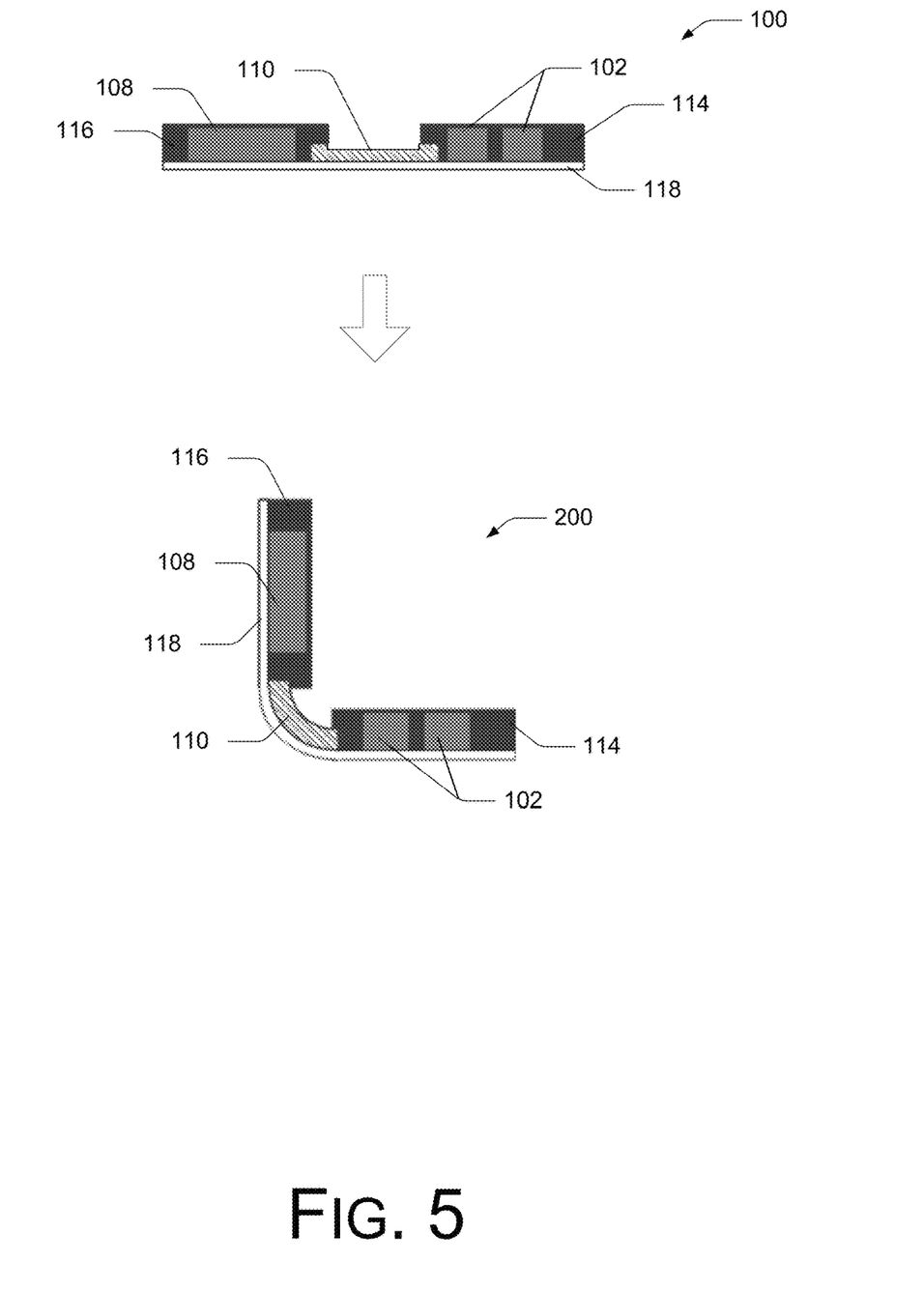

FIG. 5 shows an example of a folded microelectronic assembly 200 where the first package portion 114 (or first portion of the RDL 118) and the second package portion 116 (or the second portion of the RDL 118) form an angle of approximately 90 degrees with respect to each other. In alternate embodiments, the compliant layer 110 and the RDL 118 are folded so that the first package portion 114 (or first portion of the RDL 118) and the second package portion 116 (or the second portion of the RDL 118) form any angle greater or less than 90 degrees to form a folded microelectronic assembly 200.

FIG. 6 is an illustration showing a microelectronic assembly 100 and a folded microelectronic assembly 200 having more than first and second portions to the RDL 118 and more than first 114 and second 116 package portions coupled to the RDL 118. In various examples, the RDL 118 may have any number of portions desirable, with any quantity of microelectronic elements and package portions coupled thereon. In the example of FIG. 6, an additional compliant layer 604 is coupled to the compliant layer 118 between the first package portion 114 and an additional package portion 606 which may include one or more microelectronic elements 602. In the example, the foldable microelectronic assembly 200 may be folded at least at two locations: the location of the first compliant layer 110 and the location of the additional compliant layer 604. The shape illustrated in FIG. 6 is not intended to be limiting, and the foldable microelectronic assembly 200 may be bent or folded in any manner practical at these two locations as desired.

Figure 7:
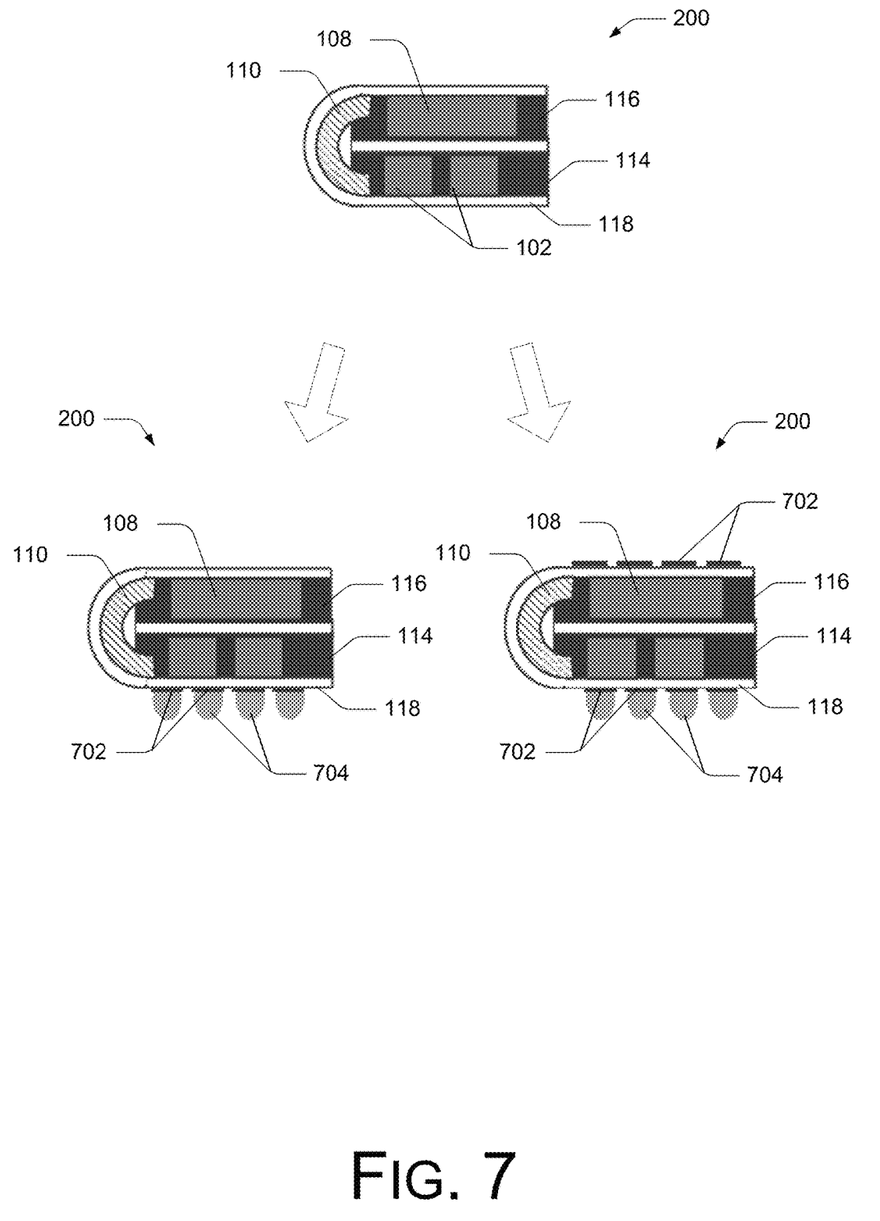
FIG. 7 is an illustration showing examples of adding terminal connections to folded microelectronic assemblies, according to example embodiments.

FIG. 7 is an illustration showing examples of adding terminal connections to folded microelectronic assemblies 200, according to example embodiments. For instance, in an embodiment, as shown in FIG. 7, one or more terminal pads 702 may be disposed on a second (i.e., outside) surface of the RDL 118 opposite the first portion or the second portion of the RDL 118. In the embodiment, the one or more terminal pads 702 are electrically coupled to one or more of the conductive layers of the RDL 118. Further, solder ball terminals 704 (such as ball grid array-type solder balls) may be coupled to a quantity of the terminal pads 702 for coupling the folded microelectronic assembly 200 to another carrier or printed circuit board (PCB), or the like.

In an implementation, one or more of the terminal pads 702 disposed on the second surface of the RDL 118 opposite the first portion (or the first package portion 114) are electrically coupled to one or more of the terminal pads 702 disposed on the second surface of the RDL 118 opposite the second portion (or the second package portion 116). In the implementation, the folded microelectronic assembly 200 forms a vertical interconnect structure.

Figure 8:
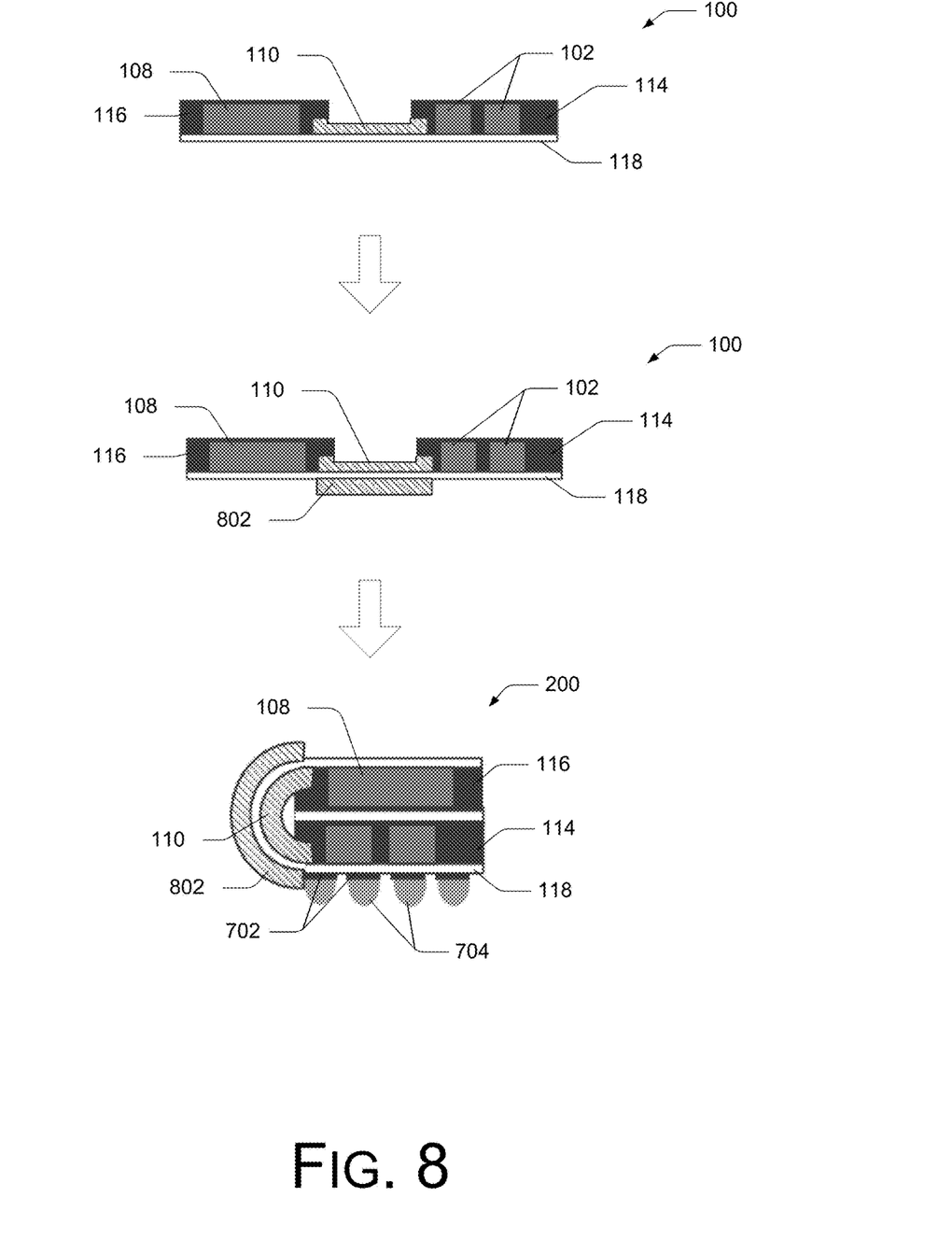
FIG. 8 is an illustration showing an example of forming a folded microelectronic assembly, according to another embodiment.

As shown in FIG. 8, in some cases it may be desirable to further reinforce a bend or fold area of a carrier 118, to further mitigate mechanical stresses of the fold or bend. As shown in FIG. 8, a second compliant layer 802 may be disposed at a second (i.e., outside) surface of the RDL 118 opposite the first compliant layer 110. In an embodiment, the second compliant layer 802 is formed to an arcuate shape to conform to the RDL 118 and the (first) compliant layer 110.

Unless otherwise specified, alternative components to those specifically mentioned may be used to implement the techniques described herein. In various implementations, the techniques described herein may be applied to stacks or groups of stacks of packaged microelectronic components 102, 108, or the like.

Figure 9:
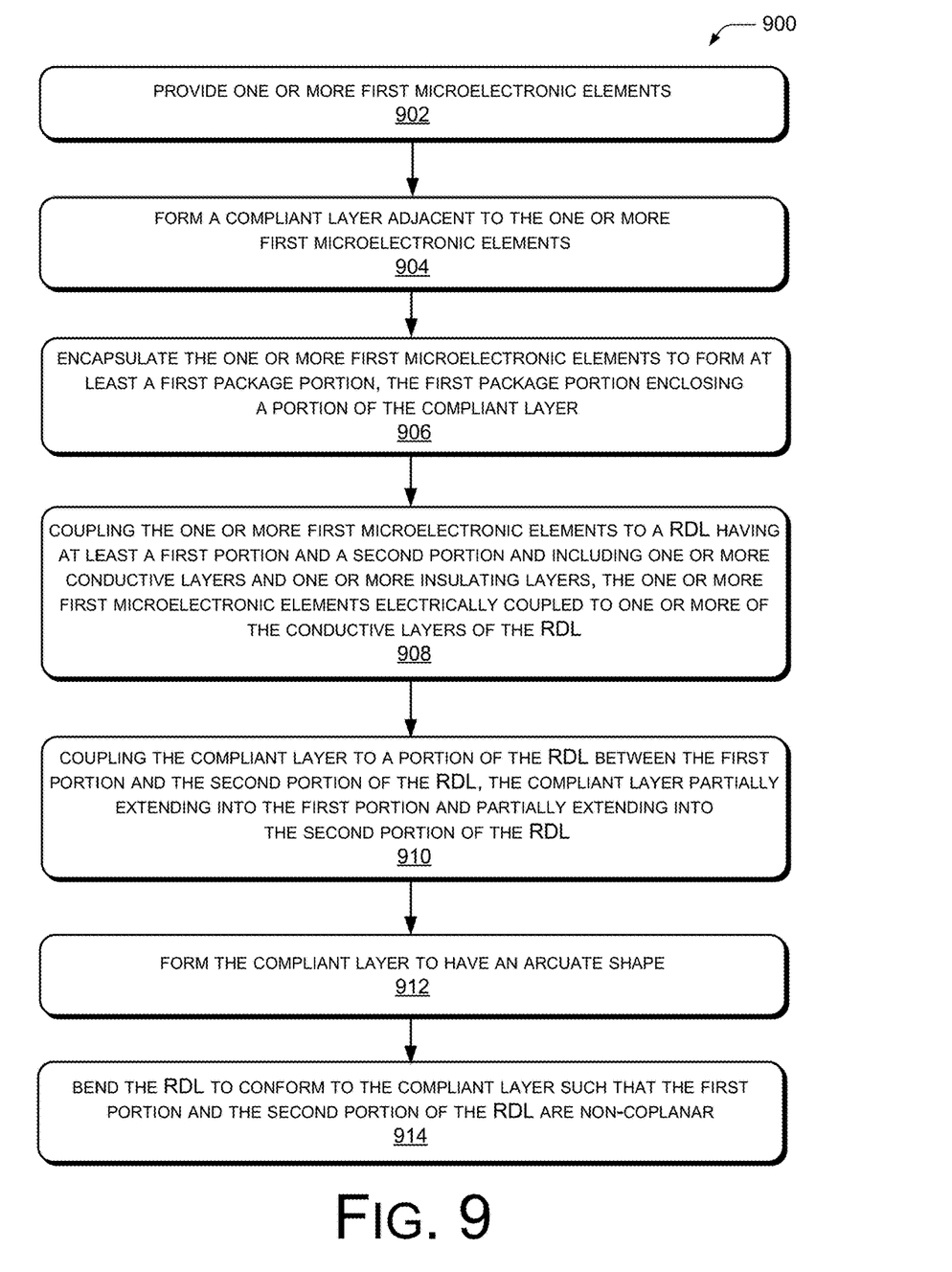
FIG. 9 is a flow diagram illustrating an example process for forming a folded microelectronic assembly, according to an example implementation.

FIG. 9 is a flow diagram illustrating an example process 900 for forming a foldable microelectronic assembly 100, according to various implementations. The use of the text-based flow diagram of FIG. 9 to illustrate the process described is an example that is not intended to be limiting.

Further, FIGS. 1-8 and their respective discussions also illustrate example processes for forming a microelectronic assembly 100 and a folded microelectronic assembly 200, in the form of graphics-based flow diagrams. Each of the processes described with respect to FIGS. 1-8 also describe a corresponding apparatus, structure, system, or the like. The blocks of FIG. 9 have reference to the arrangements shown at FIGS. 1-8.

Referring to FIG. 9, at 902, the process includes providing one or more first microelectronic elements (such as microelectronic elements 102, for example). At 904, the process includes forming a compliant layer (such as compliant layer 110, for example) adjacent to the one or more first microelectronic elements. At 906, the process includes encapsulating the one or more first microelectronic elements to form at least a first package portion (such as package portion 114, for example). In an embodiment, the first package portion comprises an encapsulant and encloses a portion of the compliant layer.

At 908, the process includes coupling the one or more first microelectronic elements to a first portion of a RDL (such as RDL 118, for example), where the RDL has at least a first portion and a second portion, and includes one or more conductive layers and one or more insulating layers. In an embodiment, the one or more first microelectronic elements are electrically coupled to one or more of the conductive layers of the RDL.

At 910, the process includes coupling the compliant layer to a portion of the RDL between the first portion and the second portion of the RDL, the compliant layer partially extending into the first portion and partially extending into the second portion of the RDL.

In an implementation, the encapsulating is performed after coupling the one or more first microelectronic elements and the compliant layer to the RDL.

In various implementations, encapsulating and coupling the microelectronic elements to the RDL includes: depositing the one or more first microelectronic elements at a first region of a temporary layer, where the temporary layer has at least a first region and a second region; depositing the compliant layer at a region of the temporary layer between the first region and the second region of the temporary layer, such that the compliant layer partially extends into the first region and partially extends into the second region of the temporary layer; placing the one or more first microelectronic elements, the compliant layer, and the temporary layer into a mold, where the mold has a first portion corresponding to the first region of the temporary layer and a second portion corresponding to the second region of the temporary layer, and the compliant layer forms a barrier between the first portion and the second portion of the mold.

In the implementations, the process includes filling the mold with encapsulant to form the first package portion, where the first package portion corresponds to the first portion of the mold, and encapsulating the one or more first microelectronic elements. The process includes removing the first package portion and the compliant layer from the mold, with the first package portion coupled to the compliant layer; and coupling the first package portion and the compliant layer to the RDL (if they aren't coupled to the RDL yet). In the implementations, the first portion and the second portion of the RDL corresponds to the first region and the second region of the temporary layer.

At 912, the process includes forming the compliant layer to have an arcuate shape. At 914, the process includes bending the RDL to conform to the compliant layer, such that the first portion and the second portion of the RDL are non-coplanar (or no longer coplanar). In an embodiment, the process includes bending the compliant layer and the RDL such that the first package portion makes contact with the second package portion, and the first and second package portions are parallel. In another embodiment, the process includes bending the compliant layer and the RDL such that the first package portion makes an angle of approximately 90 degrees with respect to the second package portion.

In an implementation, the process includes forming a second package portion (such as package portion 116, for example) adjacent to the compliant layer. The second package portion may enclose a portion of the compliant layer. In an implementation, the second package portion comprises an encapsulant and may include one or more second microelectronic elements (such as microelectronic elements 108, for example). The process includes coupling the second package portion to the second portion of the RDL, and electrically coupling the one or more second microelectronic elements (if present) to one or more of the conductive layers of the RDL.

In various implementations, forming and coupling the second package portion to the RDL includes: filling the mold with encapsulant to form the second package portion, where the second package portion corresponds to the second portion of the mold; removing the second package portion from the mold, along with the first package portion and the compliant layer, with the first package portion and the second package portion coupled to the compliant layer; and coupling the second package portion along with the first package portion and the compliant layer to the RDL. In the implementations, the second package portion may contain microelectronic elements or it may not.

In various implementations, when the second package portion contains microelectronic elements, the process includes: depositing the one or more second microelectronic elements at the second region of the temporary layer; placing the one or more second microelectronic elements into the mold; and filling the mold with encapsulant to form the second package portion, where the second package portion corresponds to the second portion of the mold, and the second package portion encapsulates the one or more second microelectronic elements.

In an alternative implementation, the first and second (if present) package portions may be formed on the RDL. For example, first and second microelectronic elements are placed on the RDL at the first and second portions of the RDL, respectively. Terminal contacts of the first and second microelectronic elements are electrically coupled to one or more conductive layers of the RDL. The compliant layer is placed on the RDL between the first and second (if present) microelectronic elements. The first and second microelectronic elements are encapsulated, forming the first and second package portions on the RDL. The compliant layer is coupled to the first and second package portions by the encapsulant, for example, at each end of the compliant layer.

In an implementation, the process includes molding first features into the first package portion and second features into the second package portion. The process further includes interlocking the first features with the second features when the compliant layer and the RDL are bent such that a surface of the first package portion makes contact with a surface of the second package portion.

In various implementations, the process includes encapsulating one or more additional microelectronic elements to form one or more additional package portions. Additional compliant layers are formed adjacent to the one or more additional package portions. The process includes coupling the one or more additional package portions to additional portions of the RDL, and electrically coupling the one or more additional microelectronic elements to one or more of the conductive layers of the RDL.

Different configurations of a foldable microelectronic assembly 100 or a folded microelectronic assembly 200 than those illustrated or discussed may be possible with different implementations, and are within the scope of the disclosure. The variations may have fewer elements than illustrated in the examples shown in FIGS. 1-9, or they may have more or alternative elements than those shown.

The order in which the processes are described herein is not intended to be construed as a limitation, and any number of the described process blocks can be combined in any order to implement the processes, or alternate processes. Additionally, individual blocks may be deleted from the processes without departing from the spirit and scope of the subject matter described herein. Furthermore, the processes can be implemented in any suitable materials, or combinations thereof, without departing from the scope of the subject matter described herein. In alternate implementations, other techniques may be included in the processes in various combinations, and remain within the scope of the disclosure.

CONCLUSION

Although the implementations of the disclosure have been described in language specific to structural features and/or methodological acts, it is to be understood that the implementations are not necessarily limited to the specific features or acts described. Rather, the specific features and acts are disclosed as representative forms of implementing example devices and techniques.

Each claim of this document constitutes a separate embodiment, and embodiments that combine different claims and/or different embodiments are within the scope of the disclosure and will be apparent to those of ordinary skill in the art upon reviewing this disclosure.

What is claimed is:

1. A microelectronic assembly, comprising:
  a multi-layer redistribution layer (RDL) including one or more conductive layers and one or more insulating layers, the RDL having at least a first portion at a first region of the RDL located at one end of the RDL and a second portion separate from the first portion at a second region of the RDL separate from the first region of the RDL, the RDL having two exterior surfaces consisting of a first exterior surface and a second exterior surface;
  a first package disposed on the first exterior surface of the RDL at the first portion of the RDL, the first package comprising a first encapsulant;
  one or more microelectronic elements coupled to the first portion of the RDL and electrically coupled to one or more of the conductive layers of the RDL, the one or more microelectronic elements disposed within the first package; and
  a compliant layer, distinct from the one or more conductive layers and the one or more insulating layers of the RDL, disposed on the first exterior surface of the RDL only at a bend portion of the RDL between the first portion and the second portion of the RDL, separating the first region of the RDL from the second region of the RDL, the compliant layer having an arcuate shape, and the RDL bent at the bend portion to conform with the compliant layer such that the first portion and the second portion of the RDL are non-coplanar.

2. The microelectronic assembly of claim 1, further comprising a second package different and separated from the first package by the compliant layer, disposed on the first exterior surface of the first layer of the RDL at the second portion of the RDL, the second package comprising a second encapsulant.

3. The microelectronic assembly of claim 2, further comprising first features molded into the first package and second features molded into the second package, the first features adapted to interlock with the second features when the compliant layer and the RDL are bent such that the first package makes contact with the second package in a predetermined arrangement.

4. The microelectronic assembly of claim 2, wherein the compliant layer and the RDL are bent such that the first package makes contact with the second package, with the first and second packages being parallel.

5. The microelectronic assembly of claim 2, wherein the compliant layer and the RDL are bent such that the first package makes an angle of approximately 90 degrees with respect to the second package.

6. The microelectronic assembly of claim 1, further comprising one or more other microelectronic elements coupled to the second portion of the RDL and electrically coupled to one or more of the conductive layers of the RDL, the one or more other microelectronic elements disposed within a second package portion comprising an encapsulant.

7. The microelectronic assembly of claim 1, further comprising one or more additional microelectronic elements coupled to one or more additional portions of the RDL and electrically coupled to one or more of the conductive layers of the RDL, the one or more additional microelectronic elements disposed within one or more additional package portions comprising an encapsulant; and
one or more additional compliant layers disposed at one or more additional bend portions of the RDL and extending partially into adjacent portions of the RDL.

8. The microelectronic assembly of claim 7, wherein one or more of the additional compliant layers are formed to an arcuate shape and the RDL is bent at the one or more additional bend portions such that adjacent portions of the RDL on either side of the one or more arcuate shaped compliant layers are non-coplanar.

9. The microelectronic assembly of claim 1, wherein the compliant layer is a first compliant layer, the microelectronic assembly further comprising a second compliant layer disposed at the second exterior surface of the RDL opposite the first exterior surface and the first compliant layer, the second compliant layer formed to an arcuate shape to conform to the RDL and the first compliant layer.

10. The microelectronic assembly of claim 1, further comprising one or more terminal pads disposed on the second exterior surface of the RDL opposite the first exterior surface and aligned to the first portion or the second portion of the RDL, the one or more terminal pads electrically coupled to one or more of the conductive layers of the RDL.

11. The microelectronic assembly of claim 10, wherein one or more of the terminal pads disposed on the second exterior surface of the RDL opposite the first portion are electrically coupled to one or more of the terminal pads disposed on the second exterior surface of the RDL opposite the second portion.

12. The microelectronic assembly of claim 11, wherein the microelectronic assembly forms a vertical interconnect structure.

13. A microelectronic assembly, comprising:
a redistribution layer (RDL) having at least a first portion at a first end of the RDL and a second portion separate from the first portion at a second end of the RDL separate from the first end of the RDL, and including one or more conductive layers and one or more insulating layers, the RDL having two exterior surfaces consisting of a first exterior surface and a second exterior surface;
a first package disposed on the first exterior surface of the RDL at the first portion of the RDL, the first package comprising an encapsulant;
a second package disposed on the first exterior surface of the RDL at the second portion of the RDL, the second package comprising an encapsulant;
one or more first microelectronic elements coupled to the first portion of the RDL and electrically coupled to one or more of the conductive layers of the RDL, the one or more first microelectronic elements disposed within the first package;
one or more second microelectronic elements coupled to the second portion of the RDL and electrically coupled to one or more of the conductive layers of the RDL, the one or more second microelectronic elements disposed within the second package; and
a compliant layer, distinct from the one or more conductive layers and the one or more insulating layers of the RDL, disposed on the first exterior surface of the RDL only at a bend portion of the RDL between the first portion and the second portion of the RDL, separating the first end of the RDL from the second end of the RDL, the compliant layer coupled to the first package to the second package, the compliant layer having an arcuate shape and the RDL having a non-planar shape at the bend portion to conform to the arcuate shape, the first portion and the second portion of the RDL being non-coplanar.

14. The microelectronic assembly of claim 13, further comprising one or more electrical terminals disposed on the second exterior surface of the RDL opposite the first package or the second package, the one or more terminals electrically coupled to one or more of the conductive layers of the RDL.

* * * * *